United States Patent
Yang et al.

(10) Patent No.: US 9,490,316 B2
(45) Date of Patent: Nov. 8, 2016

(54) SEMICONDUCTOR STRUCTURE WITH SILICON OXIDE LAYER HAVING A TOP SURFACE IN THE SHAPE OF PLURAL HILLS AND METHOD OF FABRICATING THE SAME

(71) Applicant: UNITED MICROELECTRONICS CORP., Hsin-Chu (TW)

(72) Inventors: Ching-Chung Yang, Hsinchu (TW); Shih-Yin Hsiao, Chiayi County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 14/542,672

(22) Filed: Nov. 17, 2014

(65) Prior Publication Data
US 2016/0141359 A1   May 19, 2016

(51) Int. Cl.
| | | |
|---|---|---|
| H01L 21/31 | (2006.01) | |
| H01L 21/469 | (2006.01) | |
| H01L 29/06 | (2006.01) | |
| H01L 21/762 | (2006.01) | |
| H01L 27/088 | (2006.01) | |
| H01L 29/423 | (2006.01) | |
| H01L 29/66 | (2006.01) | |
| H01L 29/78 | (2006.01) | |
| H01L 29/10 | (2006.01) | |

(52) U.S. Cl.
CPC ....... *H01L 29/0653* (2013.01); *H01L 21/7621* (2013.01); *H01L 27/088* (2013.01); *H01L 29/0649* (2013.01); *H01L 29/1033* (2013.01); *H01L 29/42368* (2013.01); *H01L 29/66659* (2013.01); *H01L 29/78* (2013.01); *H01L 29/7835* (2013.01)

(58) Field of Classification Search
None
See application file for complete search history.

(56) References Cited

U.S. PATENT DOCUMENTS

| | | | | |
|---|---|---|---|---|
| 7,576,388 B1* | 8/2009 | Wilson | ................ | H01L 29/407 257/330 |
| 2006/0189106 A1* | 8/2006 | Takami | ............... | H01L 29/0638 438/514 |
| 2011/0001196 A1* | 1/2011 | Huang | ................ | H01L 21/743 257/378 |

* cited by examiner

*Primary Examiner* — Calvin Choi
(74) *Attorney, Agent, or Firm* — Winston Hsu; Scott Margo

(57) ABSTRACT

A semiconductor structure is provided. The semiconductor structure includes a substrate, a silicon oxide layer disposed on the substrate, and at least part of a gate electrode covering the silicon oxide layer. A top surface of the silicon oxide layer is in the shape of plural hills. The silicon oxide layer can provide low on-state resistance for the semiconductor structure.

12 Claims, 5 Drawing Sheets

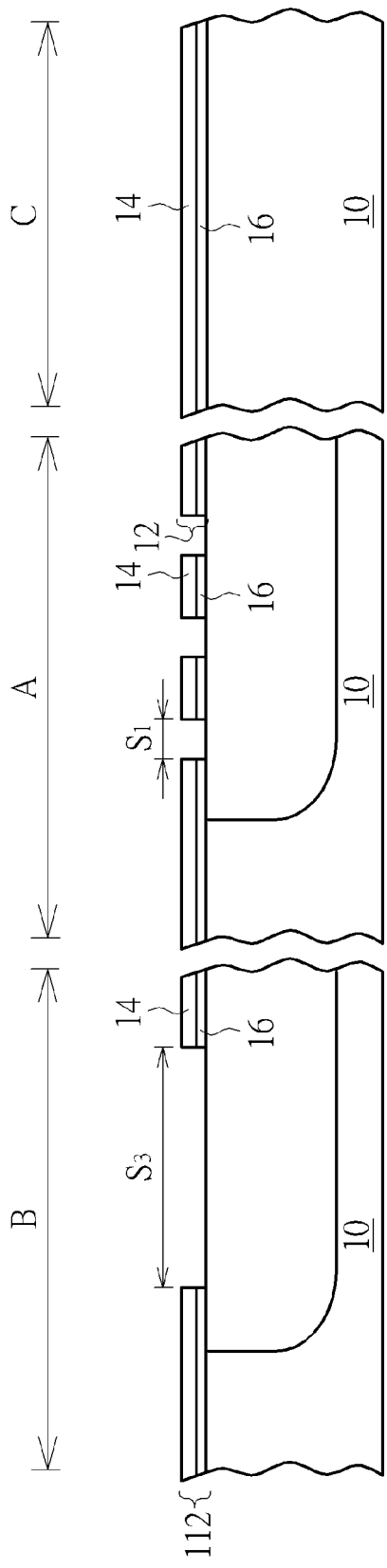
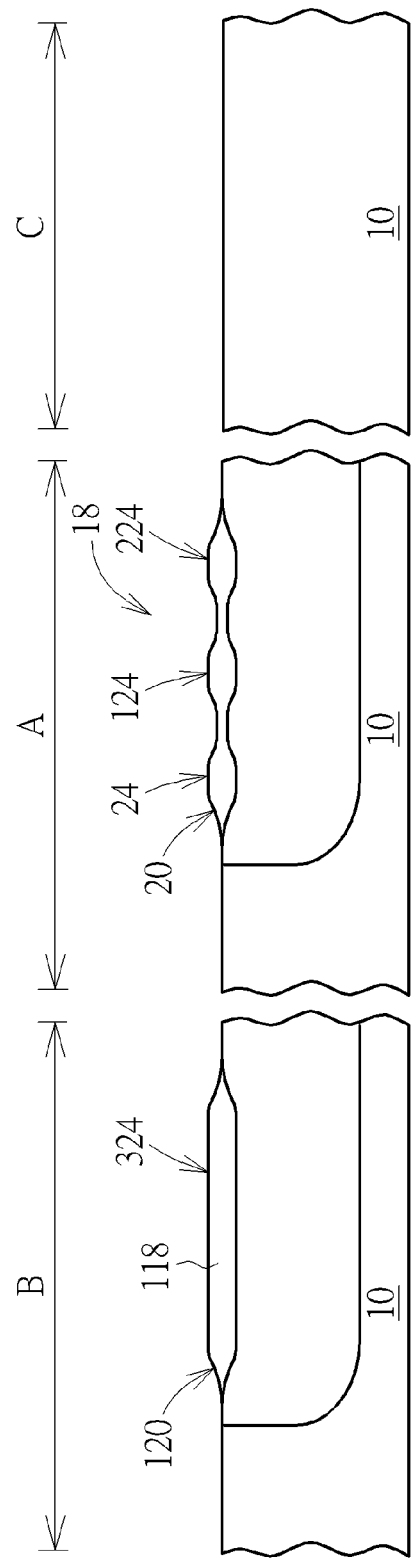
FIG. 6
FIG. 7

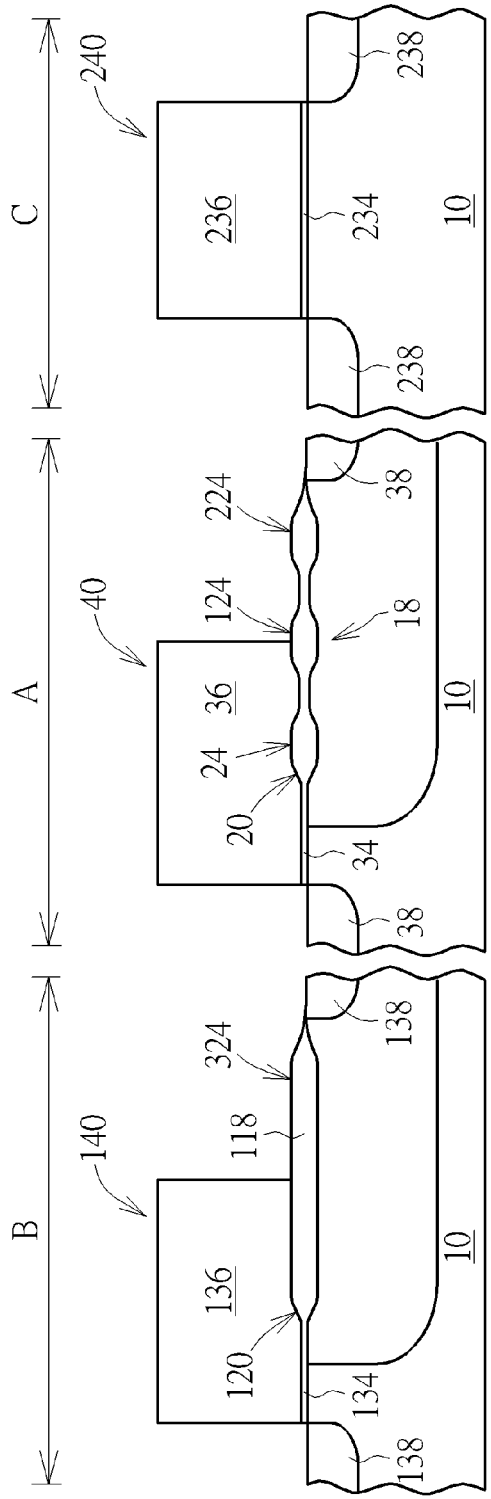
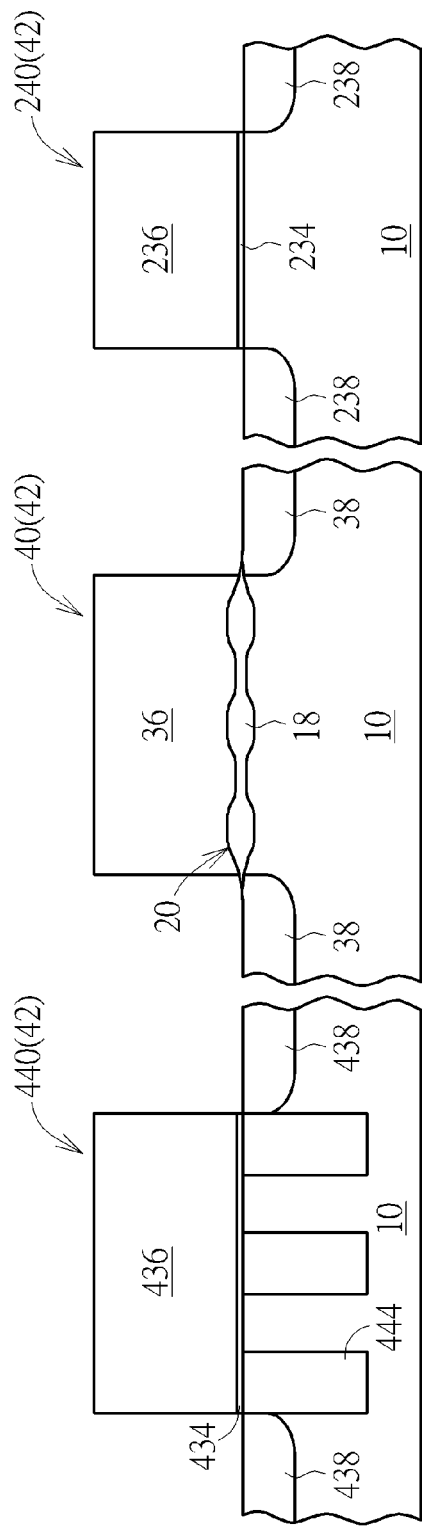
FIG. 8
FIG. 9

SEMICONDUCTOR STRUCTURE WITH SILICON OXIDE LAYER HAVING A TOP SURFACE IN THE SHAPE OF PLURAL HILLS AND METHOD OF FABRICATING THE SAME

BACKGROUND OF THE INVENTION

1. Field of the Invention

The present invention relates to a silicon oxide layer having a top surface in the shape of plural hills, wherein more particularly, the plural hills can be table-shaped or breast-shaped.

2. Description of the Prior Art

High voltage devices integrated with low voltage logic circuits are finding applications in a diverse range of office and telecommunications terminal products, particularly when combined with advances in display technology.

In order to avoid device breakdown due to generation of a very high electric field within the device, the high voltage MOS devices maybe fabricated using a planar field effect transistors (FET) with thick oxide, or with N or P channel drain-extended metal-oxide-semiconductor (DEMOS) transistor devices, such as lateral diffused MOS (LDMOS) devices.

When constrained by the gate oxide processes in use today, there are significant processing challenges to having gate oxides on the same die that can support both high voltage devices and low voltage devices operating at different voltages. A gate oxide layer on a particular die is typically optimized for either the high voltage device or the low voltage device, but not for both at the same time. Therefore, either the high voltage device or the low voltage device will not reach their original performance due to the unsuitable gate oxide layer.

SUMMARY OF THE INVENTION

Accordingly, there exists a need in the art to overcome the above-mentioned problems.

According to a first embodiment of the present invention, a semiconductor structure is provided. The semiconductor structure includes a substrate, a silicon oxide layer disposed on the substrate, and at least part of a gate electrode covering the silicon oxide layer. A top surface of the silicon oxide layer is in the shape of plural hills.

According to a second embodiment of the present invention, a fabricating method of a semiconductor structure includes the steps of providing a substrate. A plurality of first masks is then formed on the substrate. Finally, the substrate is oxidized to form a silicon oxide layer having a top surface in the shape of plural hills.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 6-8 show a fabricating method of an LDMOS and a transistor having a silicon oxide layer with a top surface in the shape of plural hills according to a preferred embodiment of the present invention.

FIG. 9 shows a semiconductor structure including an FDMOS, a transistor with a silicon oxide layer having a top surface in the shape of plural hills, and a low voltage transistor according to a preferred embodiment of the present invention.

DETAILED DESCRIPTION

Figure 1:
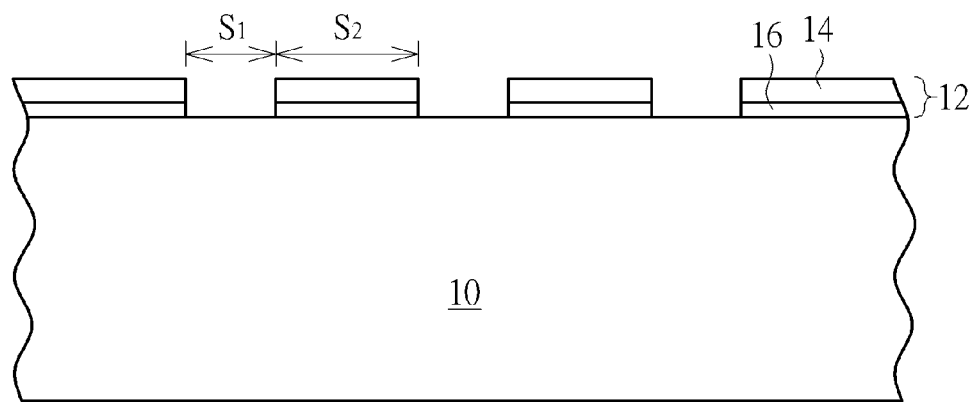
FIG. 1 is a fabricating stage of providing a substrate.

FIG. 1 is a fabricating stage of providing a substrate.

As shown in FIG. 1, a substrate 10 is provided. Then, a plurality of first masks 12 are formed on the substrate 10 which is not meant to be oxidized in the following process. More specifically, the substrate 10 is exposed through the first masks 12 in segments. The substrate 10 maybe a silicon substrate. The first masks 12 may include a silicon nitride layer 14. Preferably, the first masks 12 may have multiple layers which include a silicon nitride layer 14 and a pad oxide 16, and the pad oxide 16 is disposed between the substrate 10 and the silicon nitride layer 14. The pad oxide 16 serves as a buffer layer to prevent the silicon nitride layer 14 from creating too much tension in the substrate 10. There are at least three first masks 12 disposed on the substrate 10 and are these disconnected to each other. There are four first masks 12 in FIG. 1, but the number of the first masks 12 is not limited to four. A space $S_1$ is disposed between every two adjacent first masks 12. The first space $S_1$ is preferably between 0.1~0.2 µm. Each first mask 12 has a width $S_2$. The width $S_2$ is preferably 0.2~0.25 µm.

Later, a thermal oxidation process is performed to oxidize the exposed substrate 10. During this process, the exposed substrate 10 is consumed and replaced by silicon oxide to form numerous silicon oxide segments. While the oxidation on the substrate takes place, the pad oxide 16 causes a lateral diffusion of silicon oxide beneath the silicon nitride layer 14 and thus a slight growth of silicon oxide extends to the substrate 10 covered by the first masks 12 to forms bird's beaks. The size of the width $S_2$ is small enough so that the adjacent bird's beaks under the same first masks 12 can connect to each other. After the thermal oxidation process, the first masks 12 are removed completely.

Figure 2A:
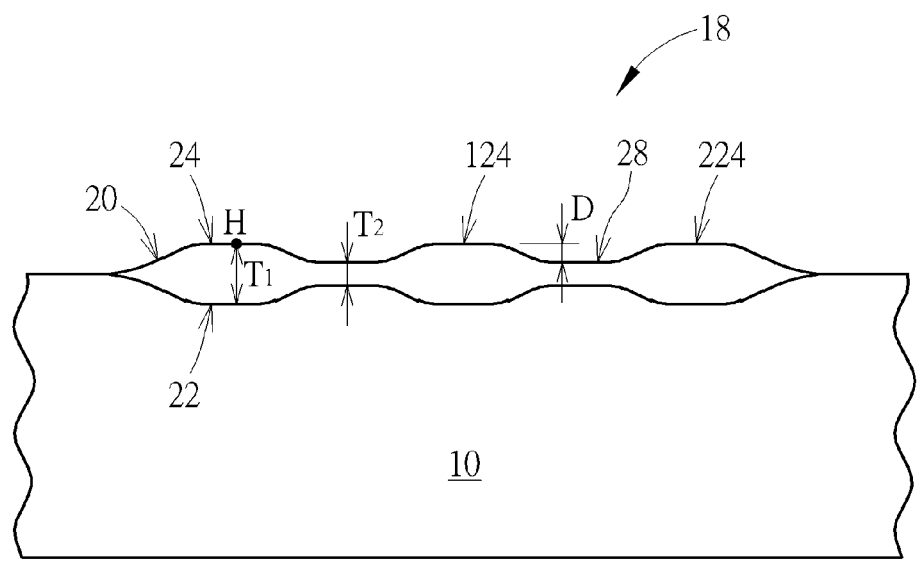
FIG. 2A and FIG. 2B show two types of a silicon oxide layer having a top surface in the shape of plural hills.
Figure 2B:
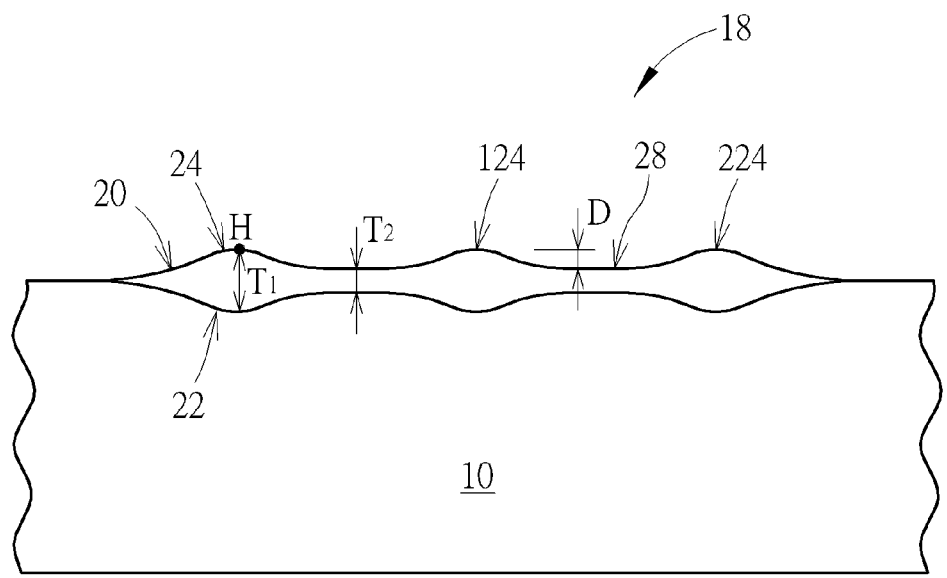

FIG. 2A to FIG. 2B show two types of a silicon oxide layer having a top surface in the shape of plural hills. As shown in FIG. 2A, at this point, the bird's beaks and the silicon oxide segments build up a plural silicon oxide layer 18.

The silicon oxide layer 18 has a top surface 20 and a bottom surface 22. Since the bottom surface 22 is symmetric to the top surface 20, only the shape of the top surface 20 is described for the sake of brevity. The top surface 20 of the silicon oxide layer 18 is in the shape of plural hills 24/124/224. The number of hills is at least two, but not limited thereto. In the present invention, the number of hills is exemplified as three. There is a valley 28 disposed between every two adjacent hills 24/124 or hills 124/224. The valley 28 connects the two adjacent hills 24/124 or hill 124/224. Each of the hills 24/124/224 is table-shaped, i.e. has a flat top. The silicon oxide layer 18 has a greatest thickness $T_1$, which is preferably about 800 Angstroms. A vertical distance D is disposed between the valley 28 and a highest point H of the hill 24. The distance D is smaller than half of thickness $T_1$ of the silicon oxide layer 18. Usually, the highest point of hills 24/124/224 are at the same height as shown in FIG. 2A. By adjusting the space $S_1$ and space $S_2$ in FIG. 1, however, the highest point of the hills 24/124/224 may be at different heights. Furthermore, the thickness $T_2$ of the silicon oxide layer 18 corresponding to the valley 28 is about 400 Angstroms.

FIG. 2B shows a varied type of the silicon oxide layer, wherein elements which are substantially the same as those in the embodiment of FIG. 2A are denoted by the same reference numerals; an accompanying explanation is therefore omitted. By adjusting the space $S_1$ between the first mask 12, the top surface 20 of the silicon oxide layer 18 may form continuous breast-shaped hills. The breast-shaped hill has a rounded top. In the following description, the shape of the top surface 20 of the silicon oxide layer 18 will be exemplified as continuous table-shaped hills. The silicon oxide layer 18 having continuous breast-shaped hills can be used in the same way, however.

Figure 3:
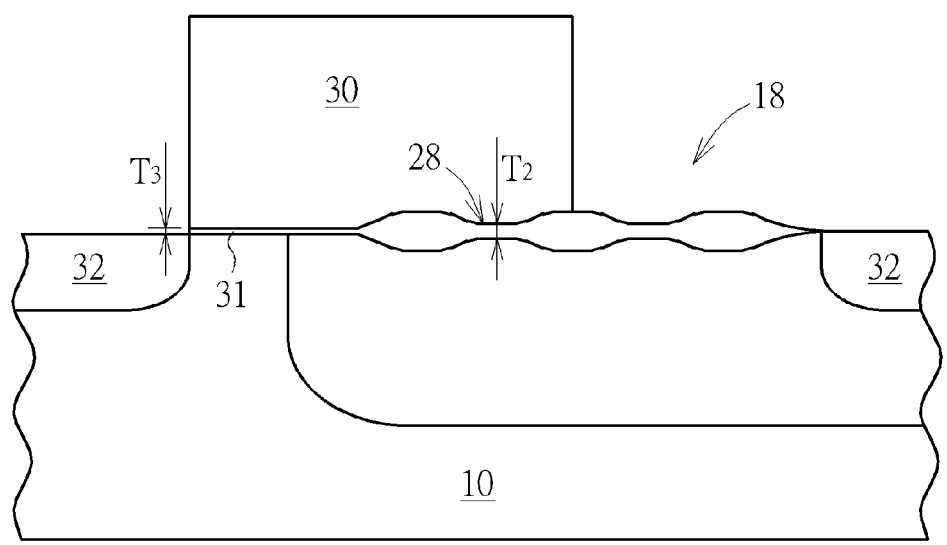
FIG. 3 to FIG. 5 show three different embodiments of transistors using a silicon oxide layer shown in FIG. 2A as gate oxide layers.
Figure 4:
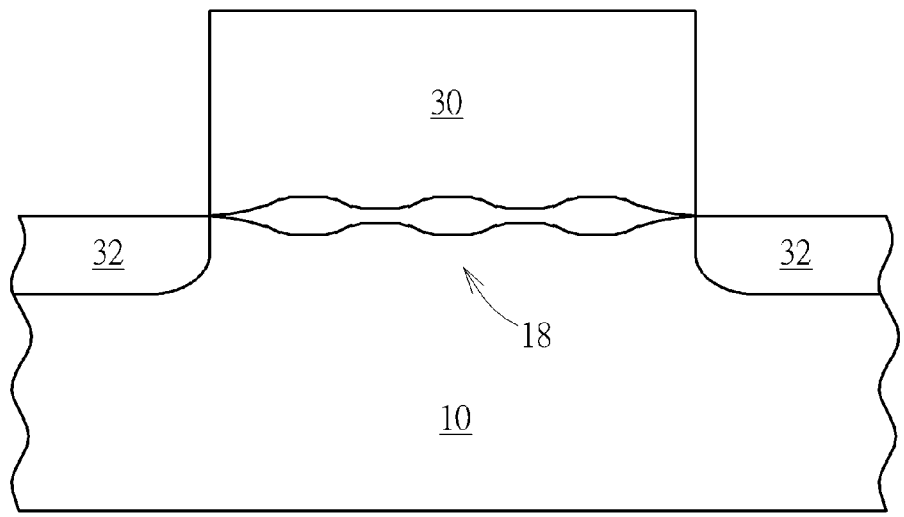
Figure 5:
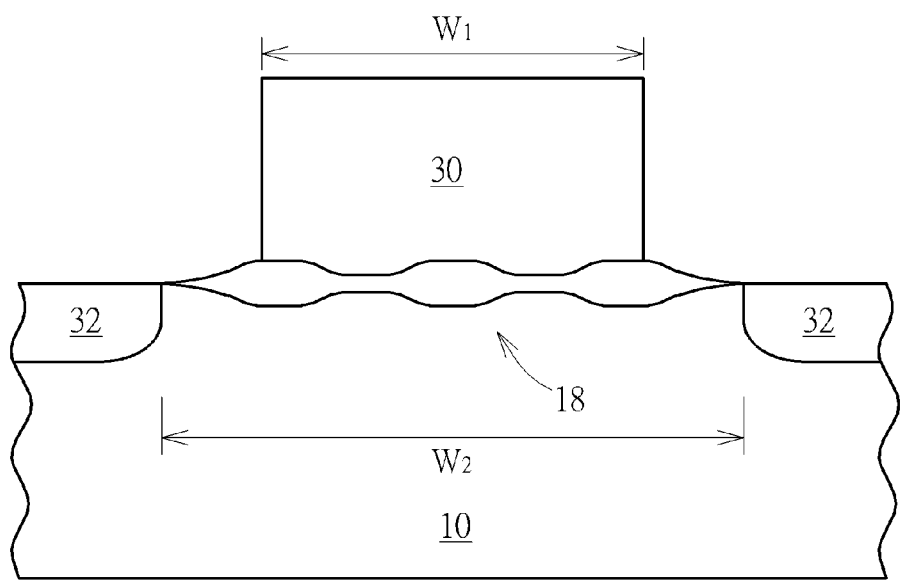

FIG. 3 to FIG. 5 show three different embodiments of transistors using a silicon oxide layer shown in FIG. 2A as gate oxide layers, wherein like reference numerals are used to refer to like elements throughout. After the silicon oxide layer 18 is formed, a gate electrode 30 can be formed on the silicon oxide layer 18. The gate electrode 30 can cover the silicon oxide layer 18 partly as shown in FIG. 3 or the gate electrode 30 can cover the silicon oxide layer 18 entirely as shown in FIG. 4. A source/drain doping region 32 can be formed at two sides of the gate electrode 30. Refer to FIG. 3. A thin oxide layer 31 is also disposed under the gate electrode 30. The thickness $T_3$ of the thin oxide layer 31 is smaller than the thickness $T_2$ of the silicon oxide layer 18. As shown in FIG. 5, according to other preferred embodiments of the present invention, a width $W_1$ of the gate electrode 30 may be smaller than the width $W_2$ of the silicon oxide layer 18. The gate electrode 30 is entirely overlapped by the silicon oxide layer 18.

FIGS. 6-8 show a fabricating method of an LDMOS and a transistor having a silicon oxide layer with a top surface in the shape of plural hills according to a preferred embodiment of the present invention, wherein like reference numerals are used to refer to like elements throughout.

As shown in FIG. 6, the method of the present invention can be combined with the fabricating process of LDMOS (laterally diffused metal oxide semiconductor). First, a substrate 10 is provided. The substrate 10 is divided into a first region A and a second region B. Then, a mask material (not shown) is formed blankly on the substrate 10. The mask material may have multiple layers which include a silicon nitride layer and a pad oxide. The mask material is patterned to form numerous first masks 12 in the first region A and form numerous second masks 112 in the second region B. The first region A of the substrate 10 is exposed through the first masks 12 in a plurality of segments. A space $S_1$ is disposed between every two adjacent first masks 12. A space $S_3$ is disposed between every two adjacent second masks 112. Space $S_3$ is larger than space $S_1$.

As shown in FIG. 7, a thermal oxidation process is performed to oxidize the exposed substrate 10. Later, the first masks 12 and the second masks 112 are removed. At this point, a silicon oxide layer 18 has a top surface 20 in the shape of plural hills 24/124/224 formed in the first region A, similar to that shown in FIG. 2A. Please refer to the previous disclosure for the detailed description of the silicon oxide layer 18. A silicon oxide layer 118 having a top surface 120 in the shape of a single hill 324 is formed in the second region B. The silicon oxide layer 118 is traditionally called an LOCOS (local oxidation of silicon) oxide layer. As shown in FIG. 8, thin oxide layers 34/134 can be formed in the first region A and second region B. After that, gate electrodes 36/136 can be formed in the first region A and second region B, respectively. The gate electrodes 36 only partly cover the silicon oxide layers 18, and the gate electrode 136 only partly covers the silicon oxide layer 118. Subsequently, source/drain doping regions 38/138 are formed at two sides of each gate electrode 36/136. An LDMOS 140 and a transistor 40 are completed at this point. According to another preferred embodiment of the present invention, the substrate 10 may include a third region C, and a low voltage MOS 240 can be formed within the third region C. A thin oxide layer 234, a gate electrode 236 and source/drain doping regions 238 of the low voltage MOS 240 can be formed in the same step for forming the thin oxide layers 34/134, the gate electrodes 36/136 and the source/drain doping regions 138 of the LDMOS 140 and the transistor 40. The thickness of the thin oxide layer 234 is preferably about 80 Angstroms. The low voltage MOS 240 is usually operated at 3.5 V to 5V.

The LDMOS 140 is for high voltage operation which means it needs to withstand high voltage, for example 32V. Therefore, the silicon oxide layer 118 of the LDMOS 140 needs a large thickness to prevent the punch through phenomenon from occurring. The transistor 40 with the silicon oxide layer 18 having a top surface 20 in the shape of plural hills 24/124/224 is designed to withstand lower voltage than the LDMOS 140, for example 24V. Therefore, the gate oxide layer for the transistor 40 does not need to be as thick as that of the LDMOS 140. The silicon oxide layer 18 having plural hills 24/124/224 can provide enough protection against the punch through phenomenon. Furthermore, because the silicon oxide layer 18 has plural hills 24/124/224, the transistor 40 can have a lower on-state resistance than the LDMOS 140 with thick silicon oxide layer 118. As a result, the silicon oxide layer 18 having plural hills 24/124/224 can increase the operational efficiency of the transistor 40.

FIG. 9 shows a semiconductor structure including an FDMOS, a transistor with a silicon oxide layer having a top surface in the shape of plural hills, and a low voltage transistor according to a preferred embodiment of the present invention, wherein like reference numerals are used to refer to like elements throughout.

As shown in FIG. 9, a semiconductor structure 42 includes FDMOS 440 (fully depleted metal oxide semiconductor transistor) and a transistor 40 with a silicon oxide layer 18 having a top surface 20 in the shape of plural hills. The semiconductor structure 42 can optionally include a low voltage MOS 240. The FDMOS 440, a transistor 40, and a low voltage MOS 240 are disposed on a substrate 10. The FDMOS 440 includes a gate electrode 436, a gate oxide layer 434, numerous STIs 444 disposed under the gate electrode 436, and two source/drain regions 438 disposed at two sides of the gate electrode 436. The transistor 40 includes a gate electrode 36, a silicon oxide layer 18 having a top surface 20 in a shape of plural hills like that in FIG. 2A, and two source/drain regions 38 disposed at two sides of the gate electrode 36. Please refer to the previous disclosure for the detailed description of the silicon oxide layer 18. The low voltage MOS 240 includes a thin oxide layer 234, a gate electrode 236, and two source/drain regions 238 disposed at two sides of the gate electrode 236.

The silicon oxide layer having plural hills provided in the present invention is suitable for high voltage devices which only need to withstand lower voltage than general high voltage devices. The plural hills can make a transistor have a lower on-state resistance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure, comprising:
   a substrate;
   a silicon oxide layer disposed on the substrate, wherein a top surface of the silicon oxide layer is in a shape of plural hills, and a valley is disposed between each two adjacent hills; and
   at least part of a gate electrode covering at least one of the hills and the valley.

2. The semiconductor structure of claim 1, wherein each of the hills is table-shaped.

3. The semiconductor structure of claim 1, wherein each of the hills is breast-shaped.

4. The semiconductor structure of claim 1, wherein the silicon oxide layer further comprises a bottom surface which is symmetric to the top surface.

5. The semiconductor structure of claim 1, wherein the gate electrode covers the silicon oxide layer entirely.

6. The semiconductor structure of claim 1, further comprising an LDMOS disposed on the substrate, wherein a gate oxide layer of the LDMOS is asymmetric, and the gate oxide layer of the LDMOS comprises a LOCOS oxide layer.

7. The semiconductor structure of claim 1, further comprising an FDMOS disposed on the substrate, wherein an STI is disposed directly under a gate electrode of the FDMOS.

8. The semiconductor structure of claim 1, further comprising a low voltage MOS disposed on the substrate, wherein a gate oxide layer of the low voltage MOS has a thickness smaller than 80 Angstroms.

9. The semiconductor structure of claim 1, wherein a vertical distance is disposed between the valley and a highest point of the hills, and the vertical distance is smaller than half of a greatest thickness of the silicon oxide layer.

10. A fabricating method of a semiconductor structure, comprising:
    providing a substrate;
    forming a plurality of first masks on the substrate; and
    oxidizing the substrate to form a silicon oxide layer having a top surface comprising at least two hills and at least one valley, wherein the valley is disposed between the two adjacent hills, wherein the hills and the valley are formed simultaneously.

11. The fabricating method of a semiconductor structure of claim 10, wherein the number of the first masks is more than three.

12. The fabricating method of a semiconductor structure of claim 10, further comprising a first space disposed between two adjacent first masks, wherein the first space is between 0.1~0.2 μm.

* * * * *